United States Patent [19]

Morisaki et al.

[11] Patent Number: 5,144,361
[45] Date of Patent: Sep. 1, 1992

[54] IMAGE RECORDING APPARATUS CAPABLE OF DETECTING MEDIUM LOADING FAILURE

[75] Inventors: Hiroshi Morisaki, Nishikasugai; Kenji Sakakibara, Ichinomiya, both of Japan

[73] Assignee: Brother Kogyo Kabushiki Kaisha, Nagoya, Japan

[21] Appl. No.: 604,880

[22] Filed: Oct. 26, 1990

[30] Foreign Application Priority Data

Oct. 30, 1989 [JP] Japan ................................. 1-282242

[51] Int. Cl.⁵ ............................................. G03B 27/32
[52] U.S. Cl. ........................................ 355/27; 355/72
[58] Field of Search .................. 355/27, 28, 32, 72; 354/173.1, 173.11; 430/138

[56] References Cited

U.S. PATENT DOCUMENTS

| | | | |
|---|---|---|---|
| 4,891,661 | 1/1990 | Tanaka et al. | 355/27 |
| 5,017,958 | 5/1991 | Katoh | 355/27 |

*Primary Examiner*—L. T. Hix
*Assistant Examiner*—Khanh Dang
*Attorney, Agent, or Firm*—Oliff & Berridge

[57] ABSTRACT

Sheet loading in an image recording apparatus is automatically performed by drawing the leading edge of an elongated, web-like image photosensitive recording medium out of a sheet cartridge, passing it through a predetermined sheet feed path provided between the sheet cartridge and a take-up shaft, and attaching the leader portion of the recording medium to the take-up shaft. A plurality of sensors are disposed alongside the sheet feed path for sensing that the sheet loading is being appropriately performed. The recording medium is successively moved to each of the sensors, and if the recording medium is not sensed thereby, it is rewound around the cartridge shaft.

4 Claims, 3 Drawing Sheets

IMAGE RECORDING APPARATUS CAPABLE OF DETECTING MEDIUM LOADING FAILURE

BACKGROUND OF THE INVENTION

The present invention relates to an image recording apparatus, and more particularly to such an apparatus capable of detecting a medium loading failure.

Conventionally, there has been known an image recording apparatus of the type in which a photosensitive pressure-sensitive recording medium is used for forming a latent image corresponding to an image of an original document. The recording medium used therein is an elongated, web-like member and is accommodated in a medium cassette in a rolled state. The medium cassette is loaded in an upper portion of the recording apparatus. The recording medium is drawn from the cassette for image exposure and wound around a take-up roller disposed in a lower portion of the apparatus. It such type of the recording apparatus, when a predetermined number of copies are made, the remaining recording medium is automatically wound up around the take-up roller, and the user is instructed to replace the old cassette with a new one. The replacement of the medium cassette also needs the replacement of the take-up roller.

When the new medium cassette is loaded, the leader portion of the recording medium needs to be attached to the take-up roller. This is done in such a way that the leader portion of the recording medium is automatically pulled out of the cassette and the recording medium is fed a predetermined length along a medium conveyance path to allow the leader portion thereof to be attached to the take-up roller. After this procedure is ended, the operator checks whether the medium loading is adequately performed. If a medium jam occurs, he removes the medium and performs the medium loading again.

However, since the occurrence of the medium jam is not checked until the recording medium is fed the predetermined length, it is difficult for the operator to find the medium loading failure at an early stage. If the medium loading failure is recovered after the medium has been erroneously introduced into a different path or wound around a roller during the medium loading, a long time and a great deal of labor are required for recovery. Further, even if a failure is such a nature that the leader portion of the recording medium is not pulled out of the cassette, this failure cannot be found until a prescribed period of time has elapsed from the feeding of the recording medium.

SUMMARY OF THE INVENTION

The present invention has been made to solve the aforementioned problems and accordingly it is an object of the invention to provide an image recording apparatus in which the medium loading failure of a photosensitive pressure-sensitive recording medium accommodated in a cassette in a rolled state can be detected at an early stage and can be quickly recovered to a condition capable of performing the medium loading without irritating an operator.

To achieve the above and other objects, there is provided an image recording apparatus which comprises a plurality of frames defining an internal space of the image recording apparatus, a medium cartridge detachably disposed in the internal space thereof, the medium cartridge accommodating an elongated, web-like photosensitive recording medium wound around a supply shaft, a take-up shaft for winding the recording medium supplied from the medium cartridge, medium moving means capable of bidirectionally moving the recording medium along a predetermined medium feed path provided between the medium cartridge and the take-up shaft, sensing means disposed apart a predetermined distance from the medium cartridge for sensing the recording medium, and control means for controlling the medium moving means to move the recording medium in a first direction by the predetermined distance and to move the recording medium in a second direction opposite the first direction when the recording medium is not sensed by the sensing means.

The loading of the recording medium is performed in such a manner that the leading edge of the recording medium is drawn out of the medium cartridge and the recording medium is moved in the first direction to attach the leading edge thereof to the take-up shaft. If the recording medium is not sensed by the sensing means during the loading operation, the recording medium is reversely moved to rewind it about the cartridge shaft.

The above and other objects, feature and advantages of the present invention will become more apparent from the following description when taken in conjunction with the accompanying drawings in which a preferred embodiment of the present invention is shown by way of illustrative example.

DETAILED DESCRIPTION OF THE PREFERRED EMBODIMENT

A preferred embodiment of the present invention will now be described with reference to the accompanying drawings.

Figure 1:
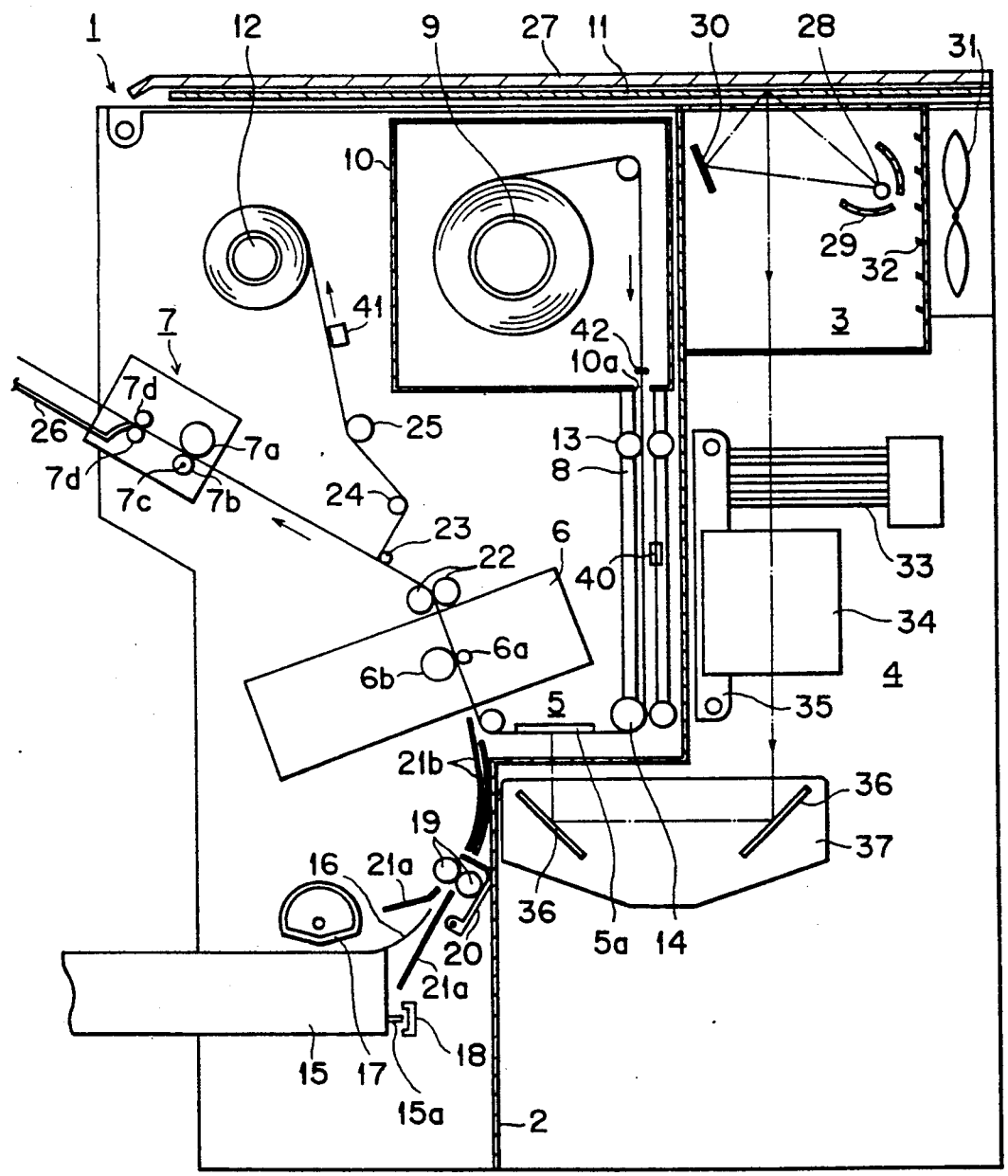
FIG. 1 is a cross-sectional view showing an image recording apparatus according to an embodiment of the present invention.

FIG. 1 shows an image recording apparatus to which the present invention is applied. The apparatus 1 shown therein is capable of performing a full-color copying. In this apparatus 1, a transfer type image recording medium as disclosed in U.S. Pat. No. 4,399,209 to Sanders et al is used. Briefly, this recording medium (hereinafter referred to as "microcapsule sheet") is coated with an immense number of microcapsules on one surface thereof. The microcapsule encapsulates photo-curing (or photo-softening) resin and a chromogenic material of one of three primary colors, cyan, magenta and yellow. There is a separate image receiving sheet (hereinafter referred to as "developer sheet") having a substrate coated with a developer material, and a heat fusible resin layer is coated on the developer material layer. A paper which is relatively small in heat storage capacity or a polyethylene terephthalate (PET) which is relatively large in heat storage capacity can be used as the substrate material of the developer sheet. When the microcapsule sheet is selectively exposed to light, the mechanical strength of the microcapsules in the exposed area is changed from soft to hard or vice versa to thereby form a latent image thereon corresponding to the pattern of the exposure. The latent image on the microcapsule sheet is developed under pressure to provide a visible image on the developer sheet by rupturing the microcapsules of weaker mechanical strength and having the chromogenic material released therefrom react with the developer material.

Referring to FIG. 1, the image recording apparatus has a plurality of frames defining an internal space thereof, and a light shielding partition plate 2 is disposed in the image recording apparatus 1 to spacedly divide the internal space into two chambers. That is, a light source unit 3 and an optical system 4 are disposed within one chamber whereas other requisite units, such as an exposure unit 5, a pressure developing unit 6, and a thermal fixing unit 7, are disposed within the other chamber.

An elongated web-like microcapsule sheet 8 wound around a cartridge shaft 9 is retained in a microcapsule sheet cartridge 10 that is detachably disposed at a position immediately below an original support pane 11 and is formed with a bottom opening 10a. An exposure unit 5 is disposed below the sheet cartridge 10 at a downstream side thereof. The sheet 8 passes through a number of rollers and a pressure developing unit 6, and a leading end of the sheet 8 is attached to a take-up shaft 12 positioned beside the sheet cartridge 10. Between the sheet cartridge 10 and the exposure unit 5, feed roller 13 and a barrel roller 14 are rotatably provided at a vertical sheet path for guiding travel of the sheet 8 toward the exposure unit 5. At the downstream side of the exposure unit 5, there is provided the pressure developing unit 6 which includes a small-diameter roller 6a and a backup roller 6b.

At a lower portion of the image recording apparatus 1, there is provided a space into which a developer sheet cassette 15 is inserted. The cassette 15 stores therein a stack of developer sheets 16. To discriminate the size of the developer sheet 16 stored therein, a projection 15a is attached to the sheet cassette 15 and a paper size discrimination unit 18 is provided in confrontation with the projection 15a. The discrimination unit 18 determines the size of the developer sheet 16 based on the size of the projection 15a. Immediately above the cassette 15, a sector roller 17 is provided to feed the uppermost developer sheet 16 toward the pressure developing unit 6. Between the cassette 15 and the pressure developing unit 6, a developer sheet guide path is provided which is defined by guide plates 21a, 21b. A pair of rollers 19 and a registration gate 20 are provided in the guide path so as to align the leading edge of the developer sheet 16.

At downstream side of the pressure developing unit 6, a pair of feed rollers 22 are provided so as to transport the sheet at a constant speed. This speed is coincident with a horizontally moving speed of the original support pane 11. At downstream of the feed rollers 22, a separation roller 23 is provided at which the microcapsule sheet 8 is separated from the developer sheet 16. The separated microcapsule sheet 8 is taken-up by the take-up shaft 12 through tension rollers 24, 25. On the other hand, the thermal fixing unit 7 is provided at the downstream side of the separation roller 23. The thermal fixing unit 7 includes a backup roller 7a and a hollow heat roller 7b, in the interior of which a heater element 7c is disposed. The thermal fixing unit 7 further includes a pair of feed rollers 7d for feeding the image fixed developer sheet 16 toward a discharge tray 26.

Next, the optical system 4 and optical path in the image recording apparatus 1 will be described. As shown, the image recording apparatus 1 has its top plate portion provided with a cover member 27 and the original support pane 11. The original support pane 11 is formed of a light transmissive material and is movable in the horizontal direction and on which an original document (not shown) is placed face down. At the upper right side of the image recording apparatus 1, fixedly provided is a halogen lamp 28 extending in the direction perpendicular to the sheet of drawing, and a semi-cylindrically shaped reflector 29 is disposed to surround the lamp 28. The halogen lamp 28 emits a light toward the original support pane 11.

Therefore, the light emitted from the halogen lamp 28 can be sequentially irradiated onto the entire surface over the region from one end to the other end of the original support pane 11 as the original support pane 11 moves horizontally. The light from halogen lamp 28 passes through the transparent original support pane 11 and is reflected from the original placed thereon. The cover member 27 is provided to prevent this light from leaking out of the image recording apparatus 1. To irradiate the light from the halogen lamp 28 onto the original at a high efficiency, a flat reflector 30 is disposed to face the halogen lamp 28 and receive the light from the lamp 28 and directs it toward the original document. At the rear side of the halogen lamp 28, there are provided a fan 31 and a louver 32 for introducing an external air into the image recording apparatus 1, with which air is effectively impinged upon the lamp 28 to cool the same.

A filter unit 33 having a plurality of filter elements is disposed below the original support pane 11. Further, a lens unit 34 is provided below the filter unit 33. Light emitted from the halogen lamp 28 and reflected from the original document passes through the filter elements and enters the lens. The filter elements alter the light transmissive characteristic in accordance with the sensitivity characteristics of the microcapsule sheet 8, to thereby adjust the color tone of a copied image. The lens is fixedly secured to a lens mounting plate 35, and fine angular adjustment of this lens with respect to a light path is achievable.

A pair of reflection mirrors 36 are provided below the lens unit 34. The focused light which has passed through the lens unit 34 changes its direction by 180 degrees (completely reverse direction) by the two reflection mirrors 36, and the thus oriented light is applied to the microcapsule sheet 8 closely contacting the bottom of an exposure table 5a to form the latent image thereon. The two reflection mirrors 36 are securely mounted to a mirror mounting plate 37. The mirror mounting plate 37 is vertically movably provided so that the adjustment of the distance of the light path and focusing adjustment can be effected by fine adjustment of the position of the mirror mounting plate 37. The original, the filter unit 33, the lens unit 34, the pair of reflection mirrors 36 and the exposure table 5a in combination define a U-shape or J-shape light path. That is, the optical path is bent into U-shape or J-shape, which path comprises a first vertical path directed downwardly, a second path directed horizontally and a third path directed upwardly. At the first optical path, the light reflected from the original is oriented downwardly, and at the third path the light is directed toward the imaging surface of the microcapsule sheet 8 on the exposure table 5a, and the reflection mirror unit 36, 37 is disposed at the second optical path extending in horizontal direction. When the mirror mounting plate 37 is downwardly moved by a certain distance, the total light path distance is increased by a distance twice as long as the moving distance of the plate 37, yet maintaining the focusing position on the exposure table 5a unchanged.

The mirror mounting plate 37 can maintain relative angular positional relationship between the pair of mirrors 36 regardless of the vertical movement of the plate 37. Accordingly, the plate 37 fixedly mounting the two mirrors 36 can be simply assembled to the image recording apparatus 1 as those can be treated as a single integral unit. It should be noted that only the pair of reflection mirrors 36 are required to obtain a normal upstanding or erect imaging direction on the exposure table 5a, since the light is finally applied onto the exposure table upwardly, i.e., the microcapsule sheet 8 on the exposure table 5a is exposed to light with the microcapsule coated surface facing down.

Next, an arrangement for performing a sheet loading operation will be described. The sheet loading is herein defined by a series of actions comprising the steps of drawing the leader portion of the microcapsule sheet 8 from the opening 10a of the microcapsule sheet cartridge 10, passing the sheet 8 along a sheet travel path, and attaching the leader portion thereof to the take-up shaft 12. The sheet loading is performed by a plurality of rollers disposed in the sheet travel path and a plurality of guide plates (not shown) defining the sheet travel path.

Inside of the microcapsule sheet cartridge 10 and in the proximity of the opening 10a, a pair of feed rollers 42 are disposed for drawing the leader portion of the microcapsule sheet 8 out of the opening of the cartridge 10. In the downstream position from the cartridge 10 apart from the opening 10a by a distance a, a first sensor 40, serving as sensing means, is disposed along side of a sheet feed path for detecting the microcapsule sheet 8. In further downstream position apart from the sensor 40 by a distance β, a second sensor 41, also serving as the sensing means, is disposed alongside of the sheet feed path for detecting the microcapsule sheet 8.

Figure 2:
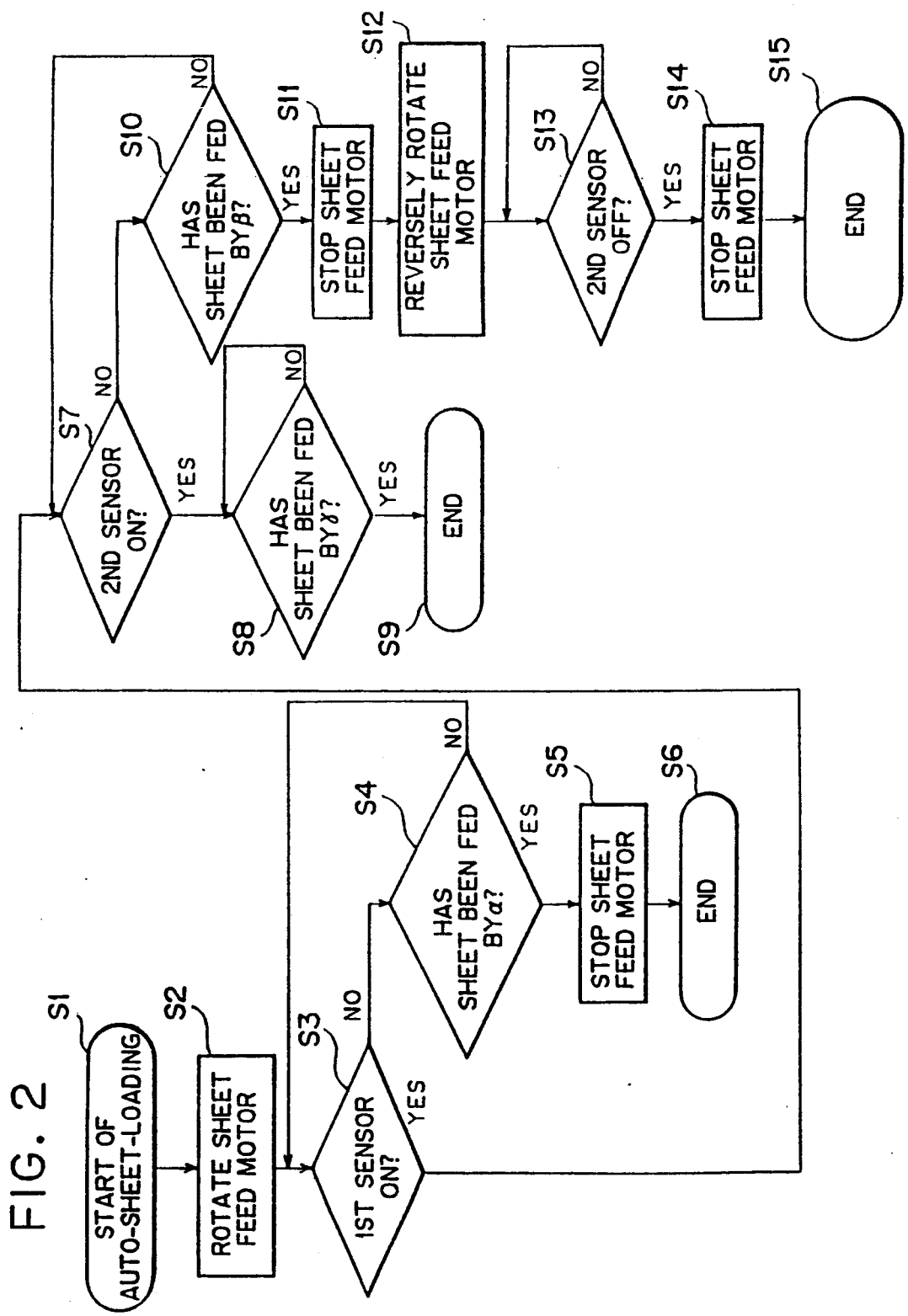
FIG. 2 is a flow chart illustrating a sheet loading sequence according to the present invention.
Figure 3:
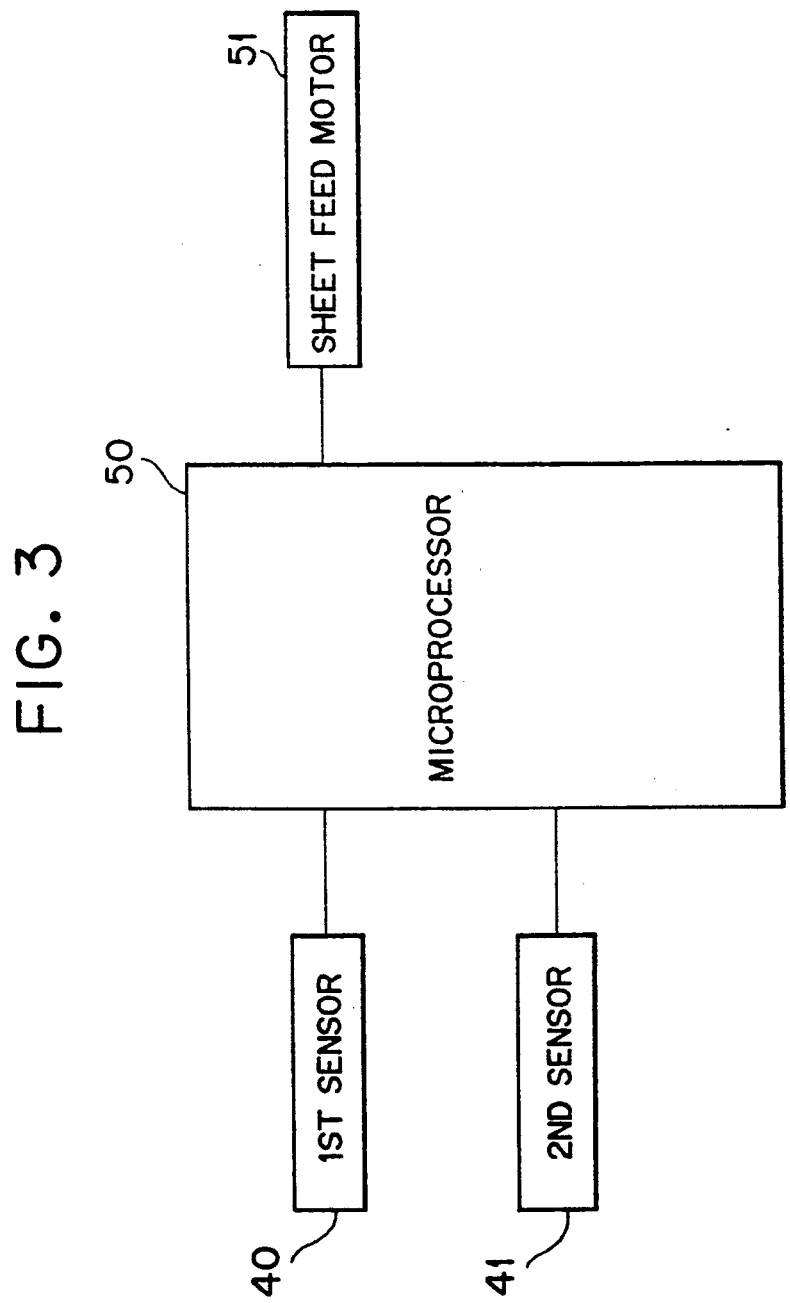
FIG. 3 is a block diagram showing an electrical arrangement of the present invention.

An electrical arrangement for performing the sheet loading operation is shown in FIG. 2. The first and second sensors 40, 41 are coupled to the input port of a microprocessor (hereinafter referred to as "CPU") 50 serving as control means, and a reversible sheet feed motor 51, serving as sheet moving means, is coupled to the output port thereof. The sheet feed motor 51 is drivingly connected to a plurality of rollers, also serving as sheet moving means, for feeding the microcapsule sheet 8, which rollers include rollers 42, 13, 22. The take-up shaft 12 is also drivingly connected to the motor 51 and is rotated thereby.

Operation of the image recording apparatus 1 thus arranged will next be described.

The image recording apparatus 1 is powered by switching a main power switch (not shown). Image recording or color copying can be performed when the original document is placed on the original support pane 11 and a start button (not shown) is depressed.

In the copying operation, the microcapsule sheet 8 drawn out from the opening 10a of the cartridge 10 is initially fed by the feed rollers 13 and advances downwardly. The microcapsule sheet 8 is then guided by the barrel roller 14. The sheet 8 then passes while contacting the lower face of the exposure table 5a where imaging light is applied to the sheet 8, so that a latent image is formed thereon.

More specifically, the cover member 27 is lifted up for placing the original document on the original support pane 11. Then, when the start button is depressed, the original support pane 11 is moved in one direction (rightwardly in FIG. 1), so that one side edge of the pane 11 (left side edge in FIG. 1) stops at a first position where the one side edge of the pane 11 is coming into confrontation with the halogen lamp 28. Thereafter, with the halogen lamp 28 being lit, the original support pane 11 is then moved in a second direction (leftwardly in FIG. 1) opposite to the first direction. The light emitted from the halogen lamp 28 is reflected from the original, and the light reflected therefrom passes through the filter unit 33 and lens unit 34 and is reflected at the two reflection mirrors 36. The reflected light is finally directed toward the microcapsule sheet 8 which is located under the exposure table 5a, thereby forming a latent image on the sheet 8. At this time, since the microcapsule sheet 8 is moved under the exposure table 5a in the second direction (leftwardly in FIG. 1) at the same speed as the moving speed of the original support pane 11, the latent image corresponding to the original image is formed on the microcapsule sheet 8 at an equi-magnitude. Since the conveying speed of the microcapsule sheet 8 is controlled to be constant by feed rollers 22 and is set equal to the moving speed of the original support pane 11, line latent images having given widths are sequentially formed on the microcapsule sheet 8 that is passing along the lower surface of the exposure table 5a.

The sheet 8 is then fed to the pressure developing unit 6. At the pressure developing unit 6, the sheet 8 and the developer sheet 16 are held in facial contact with each other and are applied with pressure to develop the latent image and form a visible image on the developer sheet 16. The microcapsule sheet 8 leaving from the cartridge 10 is kept unexposed to light due to the presence of a shielding cover 2. The developer sheets 16 are fed out one by one by the sector roller 17, and each sheet 16 is fed to a sheet inlet of the pressure developing unit 6 after the leading edge of the sheet 16 is aligned by developer sheet rollers 19 and the registration gate 20.

The microcapsule coated surface of the sheet 8 on which a latent image is formed contacts the developer coated surface of the developer sheet 16 inside the pressure developing unit 6, and these superposed sheets are pressed together by the small-diameter roller 6a and the backup roller 6b. Unexposed microcapsules are ruptured by the pressure applied, to thereby form an output image on the developer sheet 16 due to the reaction of the chromogenic material released from the ruptured microcapsules with the developer material.

In summary, in timed relation with the movement of the original support pane 11 in the second direction, the sector roller 17 feeds out the developer sheets 16 one by one from the developer sheet cassette 15. The developer sheet 16 is brought to facial contact with the exposed microcapsule sheet 8 and the both sheets are fed to the pressure developing unit 6 in which the latent image on the microcapsule sheet 8 is developed and transferred onto the developer sheet 16.

The microcapsule sheet 8 and developer sheet 16 leaving from the pressure developing unit 6 are fed out by the feed rollers 22 and are separated by the separation roller 23, the former sheet 8 directing upward and the latter sheet 16 directing in the straight direction. Thereafter, the developer sheet 16 is subjected to thermal fixing in the thermal fixing unit 7 and is then discharged onto the discharge tray 26 face up. The microcapsule sheet 8 leaving from the pressure developing unit 6 and passing through the separation roller 23 and the tension rollers 24, 25 is wound around the take-up shaft 12. When the movement of the original support pane 11 is stopped at a second position where another edge (right side in FIG. 1) of the pane 11 confronts the halogen lamp 28, the scanning of the original document is completed and the halogen lamp 28 is turned off.

Referring to the flow chart shown in FIG. 2, the sheet loading operation will be described.

When an auto-sheet-loading is instructed (step S1), the CPU 50 rotates the sheet feed motor 51 to thereby rotate the feed rollers 42 (step S2). The feed rollers 42 are rotated by the motor 51 to feed the microcapsule sheet 8 by the distance $\alpha$. Then, decision is made as to whether or not the microcapsule sheet 8 is sensed by the first sensor 40 (step S3). If the microcapsule sheet 8 is sensed, the first sensor 40 is rendered ON. If, on the other hand, the first sensor 40 is not rendered ON despite feeding the microcapsule sheet 8 by the distance $\alpha$ (steps S3, S4), it is determined by the CPU 50 that the sheet loading results in failure, whereupon the CPU 50 stops the rotation of the sheet feed motor 51 (step S5) and the sheet loading operation is ended (step S6).

If the CPU 50 receives a signal from the first sensor 40 indicating the sensing of the microcapsule sheet 8, the CPU further rotates the sheet feed motor 51 to thereby rotate the rollers 13, 22. Those rollers are rotated by the motor 51 to further feed the microcapsule sheet 8 by the distance $\beta$. Then, decision is made as to whether or not the microcapsule sheet 8 is sensed by the second sensor 41 (step S7). If sensed, the second sensor 41 is rendered ON. If the CPU 50 receives a signal from the second sensor 41 indicating the sensing of the microcapsule sheet 8, the CPU 50 further rotates the sheet feed motor 51 to further feed the microcapsule sheet 8 by a distance $\gamma$ (step S8) to enable the leading portion of the microcapsule sheet 8 to be attached to the take-up shaft 12, whereupon the sheet loading operation is ended (step S9).

If the CPU 50 does not receive the signal indicative of the sensing of the microcapsule sheet 8 from the second sensor 41 despite feeding the microcapsule sheet 8 by the distance $\beta$ (steps S7, S10), it is determined by the CPU 50 that the sheet loading results in failure, whereupon the CPU 50 stops the rotation of the sheet feed motor 51 (step S11). Subsequently, the CPU 50 reversely rotates the motor 51 to rewind the microcapsule sheet 8. As the microcapsule sheet 8 is being rewound, the first sensor 40 is rendered OFF (step S13). Then, the CPU 50 determines that the rewinding of the microcapsule sheet 8 has been completed. The CPU 50 stops the rotation of the sheet feed motor 51. In this manner, when the auto-sheet-loading results in failure, the microcapsule sheet 8 is automatically rewound and is placed in an initial condition. Since the cartridge shaft 9 is being biased in the counterclockwise direction, the microcapsule sheet 8 is not slackened within the sheet cartridge 10 but is smoothly wound around the shaft 9.

As described, according to the present invention, the sheet loading failure is detected by the sensors 40, 41 and if such occurs, the microcapsule sheet 8 is reversely moved and is wound around the cartridge shaft 9. Therefore, it is no longer necessary for the operator to manually recover the sheet loading failure.

What is claimed is:

1. An image recording apparatus comprising:
   a plurality of frames defining an internal space of the image recording apparatus;
   a medium cartridge detachably disposed in the internal space of the image recording apparatus, said medium cartridge accommodating an elongated, web-like photosensitive recording medium wound around a supply shaft, a leading edge of the recording medium being adapted to be drawn out of said medium cartridge;
   a take-up shaft for winding the recording medium supplied from said medium cartridge;
   medium moving means capable of bidirectionally moving the recording medium along a predetermined medium feed path provided between said medium cartridge and said take-up shaft, the recording medium being moved in a first direction to attach the leading edge of the recording medium to said take-up shaft to thus perform loading of the recording medium;
   sensing means disposed a predetermined distance from said medium cartridge for sensing the recording medium at a plurality of predetermined spaced positions; and
   control means for controlling said medium moving means to move the recording medium in the first direction the predetermined distance and to move the recording medium in a second direction opposite the first direction when the recording medium is not sensed by said sensing means at one of said predetermined spaced positions.

2. The image recording apparatus according to claim 1, wherein said medium moving means comprises a plurality of rollers disposed in the medium feed path, and a reversible motor operatively coupled to said plurality of rollers for rotating the rollers.

3. The image recording apparatus according to claim 2, wherein said sensing means comprises a series of sensors, each sensor successively disposed at a corresponding position of said plurality of predetermined spaced positions extending along the medium feed path, and wherein said control means controls said motor to cause successive movement of the recording medium in the first direction toward the position of each next successive sensor of said series of sensors by at least one of said plurality of rollers, and when the next successive sensor does not sense the recording medium following an actuation of said motor to cause said successive movement of the recording medium in the first direction, said control means controls said motor to cause movement of the recording medium in the second direction.

4. The image recording apparatus according to claim 3, wherein said control means controls said motor so that movement of the recording medium in the second direction is stopped when the leading edge of the recording medium passes a first sensor in said series of sensors and then passes a second sensor in said series of sensors disposed in an upstream position with respect to the first direction in which the recording medium is moved.

* * * * *